(12) United States Patent
Park et al.

(10) Patent No.: US 7,491,344 B2
(45) Date of Patent: Feb. 17, 2009

(54) METHOD FOR ETCHING AN OBJECT USING A PLASMA AND AN OBJECT ETCHED BY A PLASMA

(75) Inventors: Heung-Sik Park, Seoul (KR);
Chang-Jin Kang, Gyeonggi-do (KR);
Tae-Hyuk Ahn, Gyeonggi-do (KR);
Kyeong-Koo Chi, Seoul (KR);
Sang-Hun Seo, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 587 days.

(21) Appl. No.: 10/703,947

(22) Filed: Nov. 4, 2003

(65) Prior Publication Data
US 2004/0089632 A1 May 13, 2004

(30) Foreign Application Priority Data
Nov. 7, 2002 (KR) .................... 10-2002-0068940

(51) Int. Cl.
*C23F 1/00* (2006.01)
(52) U.S. Cl. .......... 216/71; 257/E21.218; 257/E21.599
(58) Field of Classification Search .................. None
See application file for complete search history.

(56) References Cited

U.S. PATENT DOCUMENTS

| | | | | |
|---|---|---|---|---|
| 3,050,616 A | * | 8/1962 | Gage | 219/69.1 |
| 3,660,630 A | * | 5/1972 | Sunnen et al. | 219/76.16 |
| 3,940,641 A | * | 2/1976 | Dooley | 310/11 |
| 4,048,436 A | * | 9/1977 | Hiratake et al. | 373/22 |
| 4,119,828 A | * | 10/1978 | Bykhovsky et al. | 219/121.46 |
| 4,898,748 A | * | 2/1990 | Kruger, Jr. | 427/577 |
| 5,174,983 A | * | 12/1992 | Snail | 423/446 |
| 5,462,609 A | * | 10/1995 | Patrick et al. | 148/241 |
| 5,548,611 A | * | 8/1996 | Cusick et al. | 373/18 |
| 6,184,060 B1 | * | 2/2001 | Siniaguine | 438/106 |
| 6,265,690 B1 | * | 7/2001 | Fornsel et al. | 219/121.5 |
| 6,278,241 B1 | * | 8/2001 | Enguelcht et al. | 315/111.21 |

(Continued)

FOREIGN PATENT DOCUMENTS

KR  96-000190  3/1996

(Continued)

OTHER PUBLICATIONS

English Language Abstract of PCT Application No. PCT/US97/09252.

(Continued)

*Primary Examiner*—Allan Olsen
(74) *Attorney, Agent, or Firm*—Marger Johnson & McCollom, P.C.

(57) ABSTRACT

Disclosed herein is a method for etching a face of an object and more particularly a method for etching a rear face of a silicon substrate. The object having a silicon face is positioned so as to be spaced apart from a plasma-generating member by a predetermined interval distance. The plasma-generating member generates arc plasmas to form a plasma region. A reaction gas is allowed to pass through the plasma region to generate radicals having high energies and high densities. The radicals react with the object to etch the face of the object. The face of the object can be rapidly and uniformly etched.

23 Claims, 6 Drawing Sheets

U.S. PATENT DOCUMENTS

| | | | |
|---|---|---|---|
| 6,503,366 B2 * | 1/2003 | Penelon et al. | 156/345.35 |
| 6,534,921 B1 * | 3/2003 | Seo et al. | 315/111.51 |
| 6,660,177 B2 * | 12/2003 | Carr | 216/63 |
| 6,845,733 B1 * | 1/2005 | Tokmulin et al. | 118/723 R |
| 6,949,716 B2 * | 9/2005 | Koulik et al. | 219/121.59 |
| 2002/0100751 A1 * | 8/2002 | Carr | 219/209 |
| 2003/0165636 A1 * | 9/2003 | Koulik et al. | 427/569 |
| 2004/0116752 A1 * | 6/2004 | Giapis et al. | 568/910 |
| 2004/0226658 A1 * | 11/2004 | Lai et al. | 156/345.48 |
| 2005/0084610 A1 * | 4/2005 | Selitser | 427/248.1 |
| 2005/0118350 A1 * | 6/2005 | Koulik et al. | 427/535 |

FOREIGN PATENT DOCUMENTS

| | | |
|---|---|---|
| KR | 2000-0016138 | 3/2000 |
| WO | WO9212610 A * | 7/1992 |
| WO | WO 0239791 A1 * | 5/2002 |

OTHER PUBLICATIONS

English Language Abstract of Korean Publication No. 96-000190.

\* cited by examiner

METHOD FOR ETCHING AN OBJECT USING A PLASMA AND AN OBJECT ETCHED BY A PLASMA

CROSS REFERENCE TO RELATED APPLICATIONS

This application claims priority under 35 USC § 119 to Korean Patent Application 2002-68940, filed on Nov. 7, 2002, the contents of which are herein incorporated by reference in their entirety.

BACKGROUND OF THE INVENTION

1. Field of the Invention

The present invention relates generally to semiconductor manufacturing and, more particularly, to a method for etching a face of an object and an object thereby etched.

2. Background

In the packaging process of semiconductor devices, after semiconductor devices are formed on a front face of a silicon substrate, they are divided into individual units.

The packaging process generally includes a substrate lapping step for reducing the thickness of a silicon substrate, a sawing step for sawing the silicon substrate to divide it into individual chips, a die attaching step for bonding the individual chips so that they attach to die pads of lead frames, a wire bonding step for electrically connecting the chip to leads of the lead frames, a molding step for molding the chips using molding plastics, a soldering step for plating exposed leads of the lead frames, and a folding and cutting step for shaping the soldered leads into desired shapes.

The substrate lapping process is performed to adjust the thickness of the substrate in accordance with a design specification of a semiconductor package, without damaging the front face of the substrate where the semiconductor devices are formed. The substrate-lapping step generally includes a grinding step and a polishing step. The above substrate lapping process has the advantage of being rapidly performed at a cost that is relatively low.

Generally, in the substrate lapping process that includes the grinding and polishing steps, a protective tape is attached to the front face of the substrate where the semiconductor devices are positioned in order to prevent the front face of the substrate from being damaged. The grinding step roughly grinds a rear face of the substrate, while the subsequent polishing step is used to precisely polish the rear face of the substrate. The grinding step differs from the polishing step in the processing parameters of each step, such as polishing pads used, sorts of slurries needed, rotation speeds of the rotating plates, and so on. After completing the polishing step, the protective tape is removed from the front face of the substrate.

When the substrate lapping process is attempted on a substrate having a thickness of less than about 150 μm, cracks are frequently generated in the substrate. Additionally, the slurries are often introduced between the protection tape and the front face of the substrate during these steps. Thus, the semiconductor devices on the front face of the substrate may be damaged during the lapping process. A method is therefore needed to etch the rear face of a substrate to a desired thickness while minimizing the damage to the substrate and preventing failures of the semiconductor devices on a front face of the substrate.

SUMMARY OF THE INVENTION

In order to overcome above-mentioned and other problems, a feature of the present invention provides a method for etching a face of an object to minimize the damage to the face of the object.

Another feature of the present invention provides a method for etching a rear face of a substrate to minimize the damage to the rear face of the substrate.

According to an embodiment of the present invention, an object having a silicon face is positioned over a plasma generating means, which generates arc plasmas, by about 10 to about 20 cm. A plasma region is formed by the arc plasmas generated from the torch electrodes. At this time, the arc plasmas form the plasma region at a non-contact mode under atmospheric pressure. Radicals are generated by allowing a reaction gas to pass through the plasma region. The radicals are reacted with the face of the object to etch the face of the object. In this case, reaction gases such as tetrafluoromethane ($CF_4$), sulfur hexafluoride ($SF_6$), chlorine ($Cl_2$), hydrogen bromide (HBr), etc. can be used. These may be used alone or in a mixture thereof. The reaction gas has a flow rate of about 0.5 to about 5.0 lpm (liters per minute), and the object horizontally rotates in a circular direction on an axis.

According to another embodiment of the present invention, a silicon substrate is positioned over a plasma generating means. The rear face of the silicon substrate faces a portion of the plasma generating means where arc plasmas are generated. A plasma region is formed using the arc plasmas generated from torch electrodes. The arc plasmas form the plasma region at a non-contact mode under atmospheric pressure. Radicals are generated by allowing a reaction gas to pass through the plasma region. The radicals are reacted with the rear face of the substrate to etch it.

With the present invention, a rear face of a silicon substrate can be etched at a rapid etching rate. Thus, the method of the present invention can have a faster etching rate than the conventional lapping technique.

Additionally, with the present invention, the silicon substrate can be processed to have the precise thickness desired for packaging the semiconductor devices. Hence, failures of the semiconductor devices can be minimized during a packing process including devices formed on a front face of the silicon substrate. In addition, cracks generated in the silicon substrate during etching the rear face of the silicon substrate can be prevented.

The present invention also relates to an object etched as described above.

BRIEF DESCRIPTION OF THE DRAWINGS

The above and other advantages of the present invention will become more apparent by describing in detail embodiments of the present invention with reference to the accompanying drawings, in which.

DETAILED DESCRIPTION OF THE PREFERRED EMBODIMENTS

Figure 1:
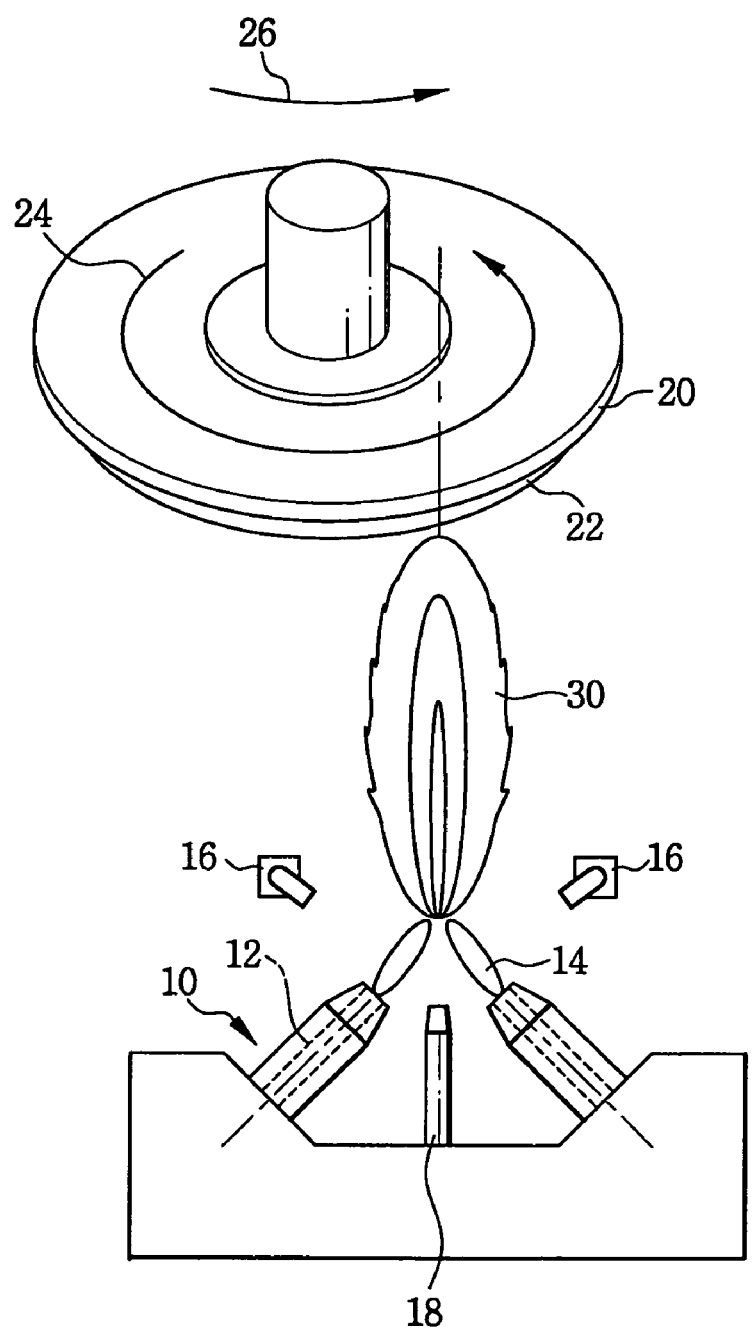
FIG. 1 is a schematic perspective view illustrating an arc plasma etching device that is used for etching a face of an object according to an embodiment of the present invention.

Hereinafter, embodiments of the present invention will be described in detail with reference to the accompanying drawings. In the following drawings, like reference numerals identify similar or identical elements.

An embodiment of the present invention describes a method for etching a face of an object. More specifically, this embodiment discloses a method of rapidly etching a silicon face of the object using at least one plasma jet etching device under atmospheric pressure. The plasma jet etching device generates an arc plasma under the atmospheric pressure so that radicals having high energies and high densities are formed from the arc plasma.

Particularly, the object is positioned over the plasma jet etching device by a predetermined interval. At this time, the face of the object is spaced apart from the portion of the plasma jet etching device where the arc plasma is generated. Direct current (D.C.) electric power and inert gases are applied to torch electrodes of the plasma generating device in order to form arc plasmas. A plasma region is formed from the arc plasmas. Possible examples of the inert gas that may be used in the present invention include argon gas, nitrogen gas, helium gas, or mixture of one or more of these gases.

A reaction gas is allowed to pass through the plasma region to generate the radicals. The radicals are sprayed onto the face of the object in order to etch it. Here, possible examples of the reaction gas include tetrafluoromethane ($CF_4$), sulfur hexafluoride ($SF_6$), chlorine ($Cl_2$), or hydrogen bromide (HBr).

When the reaction gas passes through the plasma region under the atmospheric pressure, the densities of the ions and radicals greatly increase such that the etching rate of the face of the object substantially increases.

FIG. 1 is a schematic perspective view illustrating an arc plasma etching device employed for etching a face of an object according to an embodiment of the present invention. The arc plasma etching device is operated under atmospheric pressure.

Referring to FIG. 1, the arc plasma etching device can include at least two torch electrodes 10 for generating arc plasmas 14. Each of the torch electrodes 10 has an inert gas nozzle 12 for providing an inert gas in order to generate the arc plasma 14. When the inert gases are fed to the torch electrodes 10 and D.C. electric power is applied, arc plasmas 14 are generated and jetted from the torch electrodes 10.

Magnetic conductive aligners 16, which are used to control the jet direction of the arc plasma 14, are disposed adjacent to the torch electrodes 10, respectively. The magnetic conductive aligners 16 can be included in the torch electrodes 10.

A reaction gas nozzle 18 for providing a reaction gas is disposed between the torch electrodes 10.

A holder 20 for supporting and positioning an object 22 is spaced apart from the torch electrodes 10 and the reaction gas nozzle 18 by a predetermined interval. The holder 20 is placed so as to face the inert gas nozzles 12 and to the reaction gas nozzle 18. The holder 20 is connected to a driving member (not shown). The holder 20 rotates on an axis of the object 22 in a rotating direction 24 and moves along a moving direction 26 centering around the predetermined circle on the holder 20.

Figure 2:
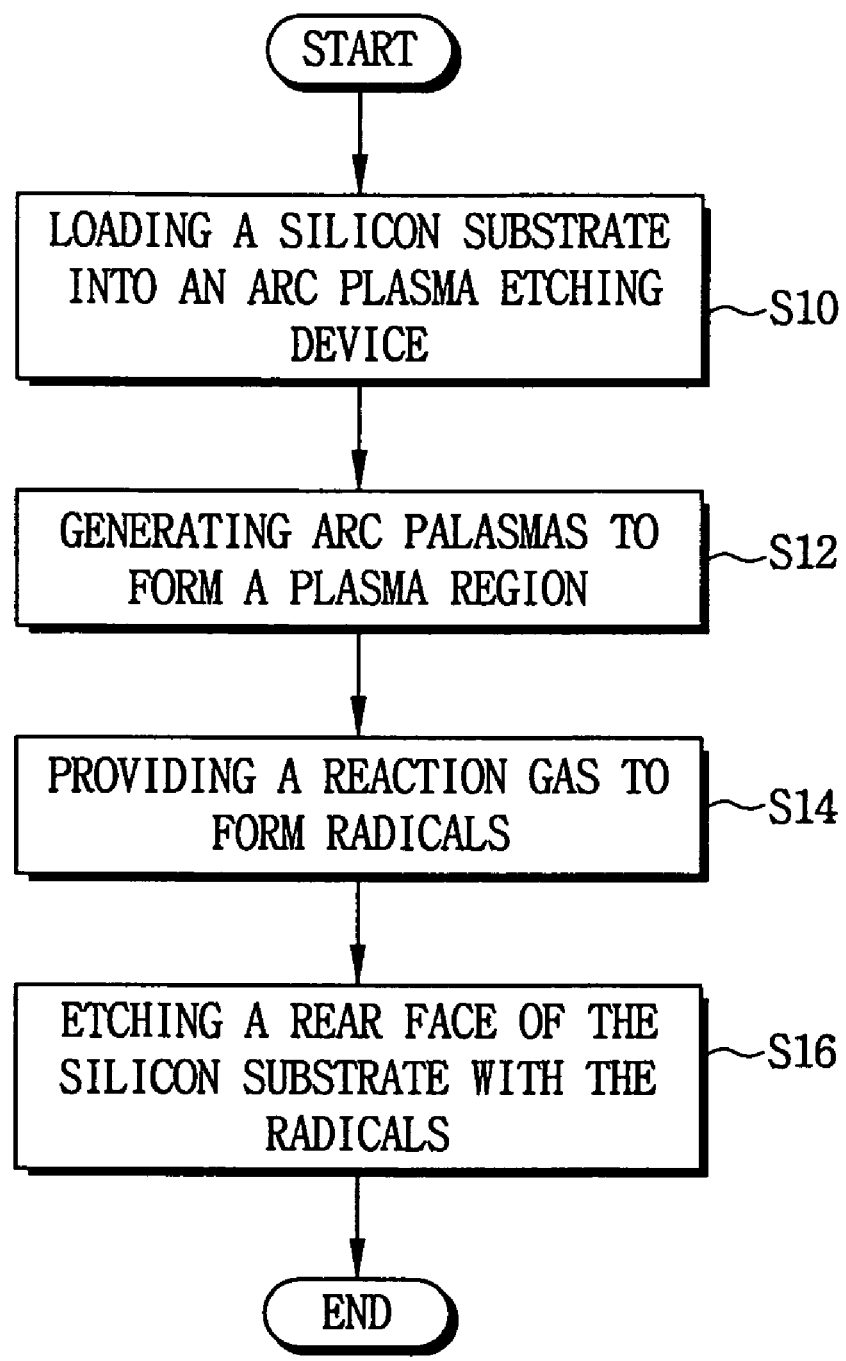
FIG. 2 is a flow chart illustrating a method for etching a rear face of a silicon substrate according to one embodiment of the present invention.

FIG. 2 is a flow chart illustrating a method for etching a rear face of a silicon substrate according to an embodiment of the present invention. The arc plasma etching device shown in FIG. 1 will serve as a reference to description of the present embodiment.

Referring to FIG. 2, a silicon substrate is loaded onto the holder 20 of the arc plasma etching device as indicated by block S10. The substrate is positioned such that its rear surface, where semiconductor devices are not formed, faces portions of the inert gas nozzles 12, where the inert gases are sprayed, and to a portion of the reaction gas nozzle 18, where the reaction gas is sprayed. The holder 20 can also include a plurality of trays formed on a disk on which the silicon substrate is displaced.

After D.C. electric power is applied to the two torch electrodes 10, inert gases are provided for generating the arc plasmas 14 from the inert gas nozzles 12 of the torch electrodes 10. Examples of the inert gas include argon (Ar) gas, nitrogen ($N_2$) gas, helium (He) gas, or a mixture of these gases. It can be advantageous to include argon gas as one of the inert gases for generating the arc plasma 14. Next, the arc plasmas 14 are diffused to form a predetermined plasma region 30 (step S12).

Reaction gas for etching the rear face of the silicon substrate is next provided through a reaction gas nozzle 18, disposed between the two torch electrodes 10, so that the reaction gas flows toward the plasma region 30. Examples of the reaction gas include tetrafluoromethane ($CF_4$), sulfur hexafluoride ($SF_6$), chlorine ($Cl_2$), or hydrogen bromide (HBr). The reaction gas is rapidly dissociated when it passes through the plasma region 30, generating radicals having high energies and high densities in order to etch the rear face of the silicon substrate (step S14).

The final step is to react the radicals with the silicon substrate to etch the rear face of the silicon substrate (step S16).

The above-described method for etching the rear face of the silicon substrate can be employed in order to adjust a thickness of the silicon substrate after the semiconductor devices are formed on the front face of the silicon substrate. In such a case, a predetermined thickness of the silicon substrate should be desired for packing the semiconductor devices formed on the front face of the silicon substrate.

Accordingly, this etching process is performed so that the etched silicon substrate has a uniform thickness. That is, the etched amounts of the rear face of the silicon substrate are identical throughout the rear face of the silicon substrate. When silicon substrates do not have a uniform thickness, the thickness of the semiconductor devices formed on the front face of the silicon substrate may be different, resulting in failures caused during the packing process for the semiconductor devices.

When the silicon substrate is etched using the above-mentioned etching process, however, the etching process is performed against only the portion of the rear face of the silicon substrate adjacent to the plasma region 30. Thus since the etching process is only locally performed on the rear face of the silicon substrate, it is preferred that the silicon substrate moves continuously to expose its substantially the entire rear surface to the radicals generated from the reaction gas. Particularly, the silicon substrate is rotated on its axis in the rotating direction 24, and moves along the moving direction 26 centering around the predetermined circle on the holder 20. That is, the silicon substrate moves along a track on the holder 20 while it is rotated. This process then uniformly etches substantially the entire rear face of the silicon substrate to the thickness desired.

The silicon substrate preferably has a thickness of about 100 to about 300 µm for packaging the semiconductor devices. The thickness of the silicon substrate has to be this thin because the semiconductor devices have been highly integrated and the weights of the semiconductor devices have been greatly reduced. Meanwhile, a bare silicon substrate for forming the semiconductor devices generally has a thickness of about 725 µm. Thus, a rear face of the bare silicon substrate should be etched by a thickness of about 425 µm or more for packaging the semiconductor devices. The etched amount of the rear face of the silicon substrate is much larger than etched amounts of other components such as films in the semiconductor devices, which are formed during the semiconductor manufacturing process. Therefore, the rear face of the silicon substrate should be etched at a much higher etching rate than those of the films of the semiconductor devices. At this time, the etching rate is indicated as etched thickness per unit time.

To achieve this desired etching rate, the etching process for etching the rear face of the silicon substrate should be performed with optimized processing parameters. Table 1 shows some of the preferred processing parameters with their values.

TABLE 1

| | value | reference |
|---|---|---|
| D.C. electric power (in KW) for generating plasma | about 8~about 15 | except a driving power |
| Flow rate of inert gas (lpm) | about 0.3~about 3 | argon gas |
| Flow rate of reaction gas (lpm) | about 0.5~about 5 | |
| interval between torch electrodes and a substrate | about 10~about 20 | |
| plasma mode | Non-contact mode | |

As shown in Table 1, a D.C. electric power of about 8 to about 12 kW is preferably applied to the torch electrodes 10 in order to generate the arc plasmas. The D.C. electric power may affect the temperature of the radicals and the temperature of the silicon substrate. For example, when the D.C. electric power is less than about 8 kW, the temperature of the radicals is low and the plasma etches the rear face of the silicon substrate with a relatively low etching rate. On the contrary, when the D.C. electric power is more than about 12 kW, the plasma etches the rear face of the silicon substrate with a relatively high etching rate, however, cracks may be generated in the silicon substrate because the temperature of the silicon substrate becomes too high. Additionally, the torch electrodes 10 may be damaged due to a high D.C. electric power.

The argon gas preferably has a flow rate between about 0.3 and about 3 liters per minute (lpm) in order to optimally generate the plasmas. When the flow rate of the argon gas is less than about 0.3 lpm, the plasma is hardly generated from the torch electrode 10. If the flow rate of the argon gas is more than about 3 lpm, the stability of the plasma may be deteriorated.

The interval distance between the silicon substrate and the torch electrodes 10 is preferably about 10 to about 20 cm. This interval between the silicon substrate and the torch electrodes 10 should be determined in consideration of the possible damage to the silicon substrate due to the plasma and the desired etching rate of the rear face of the silicon substrate. Namely, the interval is determined so that the damage of the silicon substrate is minimized while still achieving a respectable etching rate of the rear face of the silicon substrate. When the silicon substrate is spaced apart from the torch electrodes 10 by an interval of less than about 10 cm, the silicon substrate may be easily damaged from the plasmas generated from the torch electrodes 10. On the contrary, when the silicon substrate is spaced apart from the torch electrodes 10 by an interval of more than about 20 cm, the etching rate of the rear face of the silicon substrate may be drastically reduced because the radicals generated in the plasma region may hardly reach to the rear face of the silicon substrate.

Figure 3:
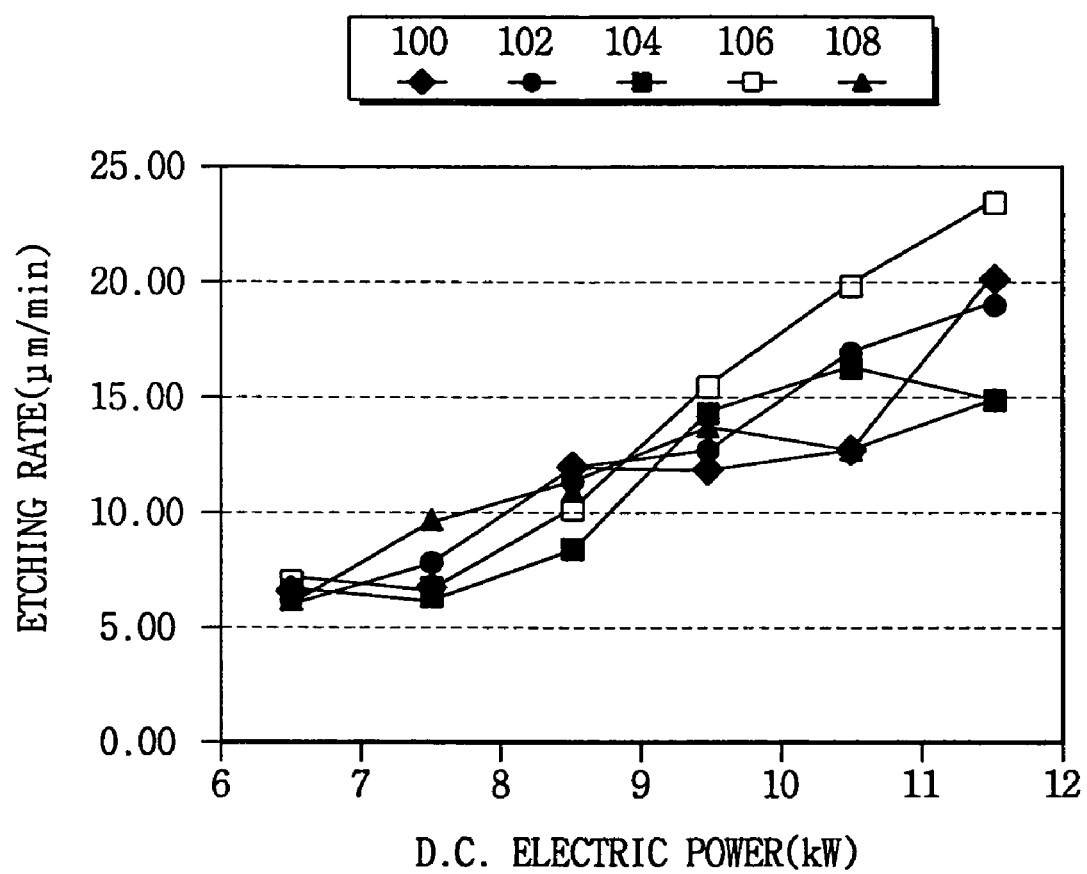
FIG. 3 is a graph illustrating etching rate variations of a rear face of a silicon substrate relative to D.C. electric power.

FIG. 3 is a graph illustrating etching rate variations of the rear face of the silicon substrate relative to a D.C. electric power. In FIG. 3, argon gas was provided at a flow rate of about 0.7 lpm, and the reaction gas included $CF_4$. Reference numerals 100, 102, 104, 106 and 108 represent etching rates of the silicon substrate when the flow rates of the reaction gas are about 2 lpm, 3 lpm, 4 lpm, 5 lpm, and 6 lpm, respectively.

Referring to FIG. 3, the etching rate of the rear face of the silicon substrate increases in accordance with additional D.C. electric power. However, the etching rate of the rear face of the silicon substrate does not increase in proportional to larger flow rates of the reaction gas. The range of etching rates went from about 5 to about 25 µm/min according to the D.C. electric power and the flow rates of the reaction gas. In FIG. 3, the etching rate of the rear face of the silicon substrate was not measured for the time of an entire etching process but only for a real reaction time.

The reaction gas preferably has a flow rate of about 0.5 to about 5 lpm, though the flow rate of the reaction gas may be varied in accordance with the kinds of reaction gases used. When the flow rate of the reaction gas is excessively low, the density of the radicals generated from the reaction gas may be too low for practical etching. On the contrary, when the flow rate of the reaction gas is too high, scattered radicals may be augmented.

Figure 4:
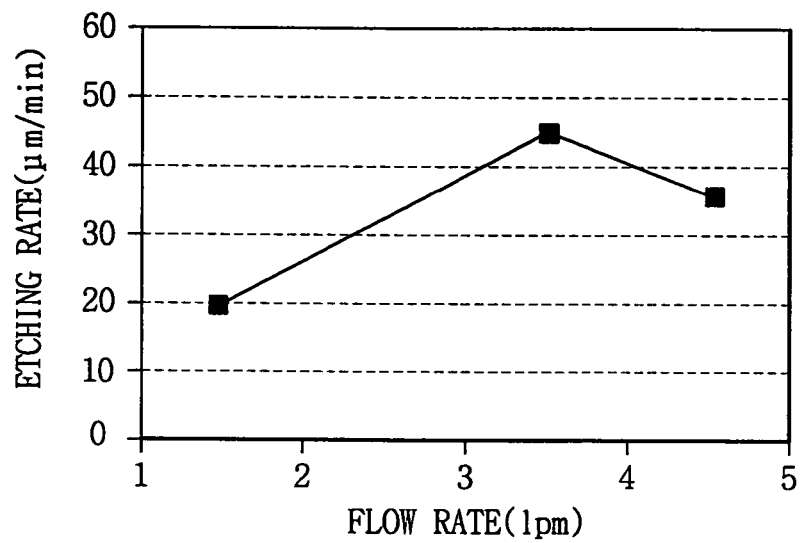
FIG. 4 is a graph illustrating an etching rate of a rear face of a silicon substrate relative to a flow rate of $CF_4$.
Figure 5:
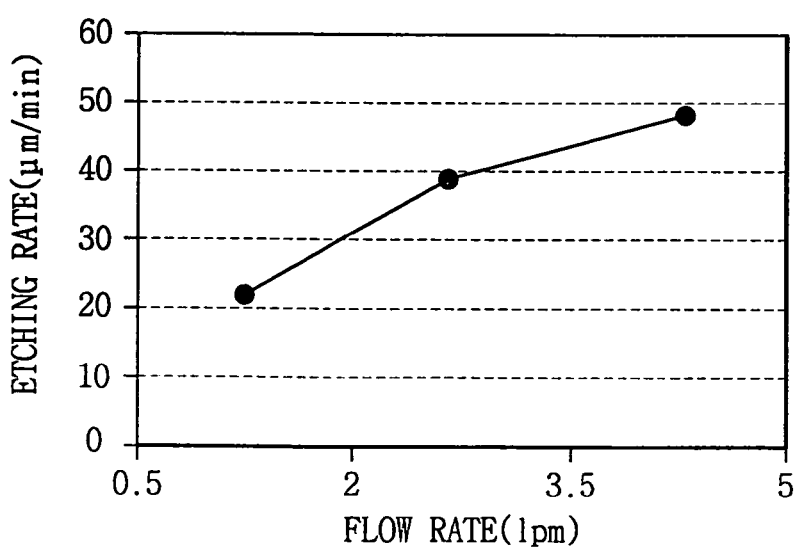
FIG. 5 is a graph illustrating an etching rate of a rear face of a silicon substrate relative to a flow rate of $SF_6$.

FIG. 4 is a graph illustrating an etching rate variation of the rear face of the silicon substrate relative to a flow rate of $CF_4$, and FIG. 5 is a graph illustrating an etching rate variation of the rear face of the silicon substrate relative to a flow rate of $SF_6$.

Referring to FIG. 4, the etching rate of the rear face of the silicon substrate initially increases in proportional to an augmentation of the flow rate of $CF_4$, however, the etching rate of the rear face of the silicon substrate slightly decreases when the flow rate of the $CF_4$ is more than about 4 lpm.

Referring to FIG. 5, the etching rate of the rear face of the silicon substrate increases according to an augmentation of the flow rate of $SF_6$. However, the degree of augmentation decreases when the flow rate of the $SF_6$ is between about 3.5 to 5 lpm compared to the flow rate of the $SF_6$ from about 2 to 3.5 lpm.

An additional parameter that changes the etching rate of the rear face of the silicon substrate is whether or not end portions of the arc plasmas generated from the torch electrodes 10 overlap with each other.

Figure 6A:
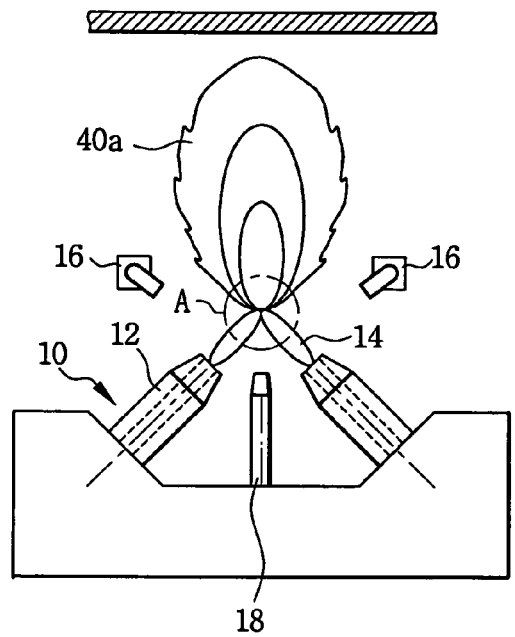
FIG. 6A and FIG. 6B are schematic cross-sectional views illustrating plasma regions in accordance with contact conditions of arc plasmas, respectively.
Figure 6B:
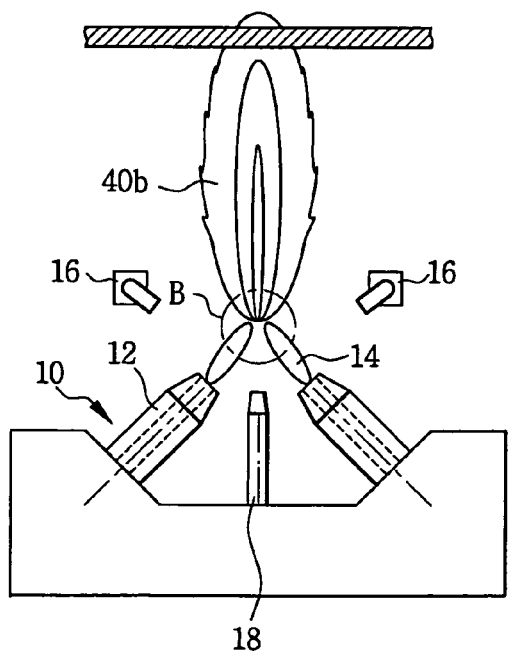

FIG. 6A and FIG. 6B are schematic cross-sectional views illustrating plasma regions in accordance with contact conditions of arc plasmas.

FIG. 6A is a schematic cross-sectional view illustrating a contact mode A, where end portions of the arc plasmas 14 make contact with each other. In the contact mode A shown in FIG. 6A, the plasma region 40a formed by overlapped arc plasmas 14 has a relatively wide width while its height is relative low.

FIG. 6B is a schematic cross-sectional view illustrating a non-contact mode B, where end portions of the arc plasmas 14 do not make contact with each other. As shown in FIG. 6B, in the non-contact mode B, a plasma region 40b formed by the arc plasmas 14 has relatively narrow width while its height is relatively high.

Various experiments demonstrate that when the etching process is performed under the contact mode, the etching rate of the rear face of the silicon substrate is lower than when the etching process is performed under the non-contact mode. All of the other processing parameters were not changed during these experiments.

Figure 7:
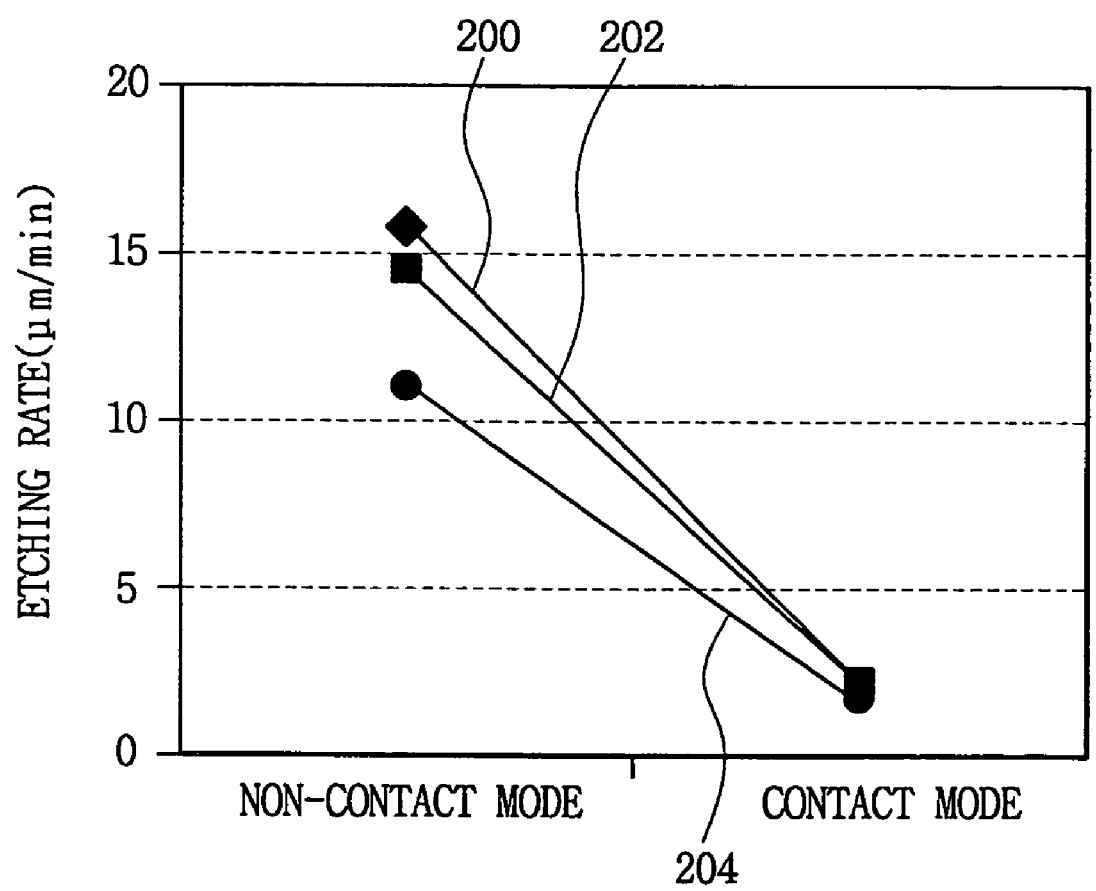
FIG. 7 is a graph illustrating etching rate variations of a rear face of a silicon substrate in accordance with contact conditions of arc plasmas.

FIG. 7 is a graph illustrating etching rate variations of the rear face of the silicon substrate in accordance with contact conditions of the arc plasmas.

In FIG. 7, the etching process for the rear face of the silicon substrate was performed with the following processing parameters:

a D.C. electric power of about 10 kW;

a gas for generating a plasma that included an argon gas, which was provided at a flow rate of about 1 lpm;

a first reaction gas 200 that included $SF_6$, which was provided at a flow rate of about 3 lpm;

a second reaction gas 202 that included $SF_6$, which was provided at a flow rate of about 3 lpm and a mixed gas, which was provided at a flow rate of about 0.2 to 0.3 lpm; and a third reaction gas 204 that included $CF_4$, which was provided at a flow rate of about 3 lpm.

Etching processes were performed with the above-mentioned processing parameters under the contact mode and under the non-contact mode, respectively.

Referring to FIG. 7, when the etching process was performed under the non-contact mode, the etching rate of the rear face of the silicon substrate was about 11 to about 16 µm/minute. In contrast, the etching rate of the rear face of the silicon substrate was only about 2 to 3 µm/minute when the etching process was performed under the contact mode. Thus, the etching rate obtained under the non-contact mode was about two to eight times larger than that obtained under the contact mode.

Because a native oxide film is formed beneath the rear face of the silicon substrate during the etching process, the etching rate obtained under the contact mode is lower than that obtained under the non-contact mode. When the etching process is performed under atmospheric pressure, the native oxide film is rapidly formed beneath the rear face of the silicon substrate as compared with a general dry etching process performed under vacuum pressure. When the native oxide film is formed beneath the rear face of the silicon substrate, the etching rate of the silicon substrate becomes very low.

Meanwhile, because the non-contact mode has a plasma region with a relatively narrow width and a relatively high height, the pressures of the radicals and the reaction gas on the rear face of the silicon surface is much higher than those obtained under the contact mode. The high pressures of the radicals and the reaction gas can prevent the formation of the native oxide film beneath the rear face of the silicon substrate. Thus, the etching rate obtained under the non-contact mode is much higher than that obtained under the contact mode.

Contact and non-contact modes can be generated according to adjustments of the jetting angles of the arc plasmas. Additionally, the jetting angle of the arc plasma can be controlled by applying a magnetic field of about 10 Gauss through the magnetic conduction aligners 16.

In the above-described method, a rear face of a silicon substrate can be etched at an etching rate of about 45 µm/minute on the basis of a real reaction time. This translates to an etching rate based on the entire reaction time of the rear surface of a substrate of about 5 µm/minute. Thus, the method of the present invention can have an advantageous etching rate in comparison with the conventional lapping method, employing a polishing process, for etching the rear face of the silicon substrate.

Also, in the above-described method, the silicon substrate can have a precisely processed thickness which is desired for packaging semiconductor devices. Hence, failures of the semiconductor devices can be advantageously minimized during a packing process.

According to the present invention, a rear face of a silicon substrate is rapidly etched employing a plasma etching method under atmospheric pressure. This precise etching process minimizes failures of the semiconductor devices formed on the front face of a silicon substrate and helps the prevention of the cracks generated in the silicon substrate during etching of the rear face of the silicon substrate.

Although embodiments of the present invention have been described, it should be understood that the present invention is not be limited to the embodiments shown and described. For example, although the present invention has been described with respect to a silicon substrate, the principles of the present invention may be applied to the substrates of other materials. Various changes and modifications in form and detail can be made to the embodiments described without departing from the spirit and scope of the present invention as hereinafter claimed.

What is claimed is:

1. A method for etching a face of an object comprising:

positioning the face of the object apart from a plasma generating means for generating arc plasmas by a predetermined interval;

forming a plasma region by using arc plasmas generated from torch electrodes under atmospheric pressure, wherein the plasma region comprises first portions of the arc plasmas that are diffused together, wherein second portions of the arc plasmas that are immediately adjacent to the plasma region do not directly contact each other;

generating radicals by transmitting a reaction gas through the plasma region, wherein the reaction gas first contacts the arc plasmas exterior to the plasma generating means; and reacting the radicals with the face of the object, wherein the reaction gas comprises at least one selected from the group consisting of tetrafluoromethane ($CF_4$), sulfur hexafluoride ($SF_6$), chlorine ($Cl_2$), and hydrogen bromide (HBr).

2. The method of claim 1, wherein the object includes a silicon substrate.

3. The method of claim 1, wherein the reaction gas is provided by a flow rate of about 0.5 to about 5.0 liters per minute (lpm).

4. The method of claim 1, wherein the face of the object is separated from a portion of the plasma generating means by an interval distance of about 10 to about 20 cm.

5. The method of claim 1, further comprising moving the object so that the object is uniformly exposed to the radicals.

6. The method of claim 5, further comprising rotating the object horizontally on an axis thereof, while the object horizontally moves in a circular direction.

7. The method of claim 1, wherein forming the plasma region further comprises:

applying D.C. electric power to the torch electrodes for generating the arc plasmas; and providing the torch electrodes with inert gases to generate the arc plasmas.

8. The method of claim 4, wherein the D.C. electric power is about 3 to about 15 kW.

9. The method of claim 7, wherein the inert gas is provided at a flow rate of about 0.3 to about 3.0 lpm to the torch electrodes.

10. A method for etching a rear face of a silicon substrate comprising:

positioning the silicon substrate over a plasma generating means so that the rear face of the silicon substrate faces a portion of the plasma generating means where arc plasmas are generated;

forming a plasma region by using arc plasmas generated from torch electrodes under atmospheric pressure, wherein the plasma region comprises first portions of the arc plasmas that are diffused together, wherein second portions of the arc plasmas that are immediately adjacent to the plasma region do not directly contact each other;

generating radicals by allowing a reaction gas to pass through the plasma region; and reacting the radicals with the rear face of the substrate.

11. The method of claim 10, wherein the rear face of the silicon substrate is separated from the portion of the plasma generating means by an interval distance of about 10 to about 20 cm.

12. The method of claim 10, wherein the reaction gas comprises at least one selected from the group consisting of $CF_4$, $SF_6$, $Cl_2$, and HBr.

13. The method of claim 10, wherein the reaction gas has a flow rate of about 0.5 to about 5.0 lpm.

14. The method of claim 10, wherein forming the plasma region further comprises:

applying D.C. electric power to the torch electrodes for generating the arc plasmas; and providing the torch electrode with inert gases to generate the arc plasmas.

15. The method of claim 14, wherein the D.C. electric power is about 3 to about 15 kW.

16. The method of claim 14, wherein the inert gas comprises at least one selected from the group consisting of an argon gas, a nitrogen gas, a helium gas.

17. The method of claim 14, wherein the gas is provided at a flow rate of about 0.3 to about 3.0 lpm to the torch electrodes.

18. The method of claim 10, further comprising moving the silicon substrate so that the rear face is uniformly exposed to the radicals.

19. The method of claim 18, further comprising rotating the silicon substrate horizontally on an axis thereof, while the silicon substrate horizontally moves in a circular direction.

20. A method of etching a face of a silicon substrate, the method comprising:

generating arc plasmas from torch electrodes to form a plasma region under atmospheric pressure, wherein visible boundaries of the arc plasmas do not directly contact each other, a selected region of the face being positioned a predetermined distance from the plasma region, wherein the plasma region comprises first portions of the arc plasmas that are diffused together, wherein second portions of the arc plasmas that are immediately adjacent to the plasma region do not directly contact each other; and passing a gas through the plasma region to generate radicals having high energies and high densities, whereby the radicals react with the face of the object to etch the face.

21. The method of claim 20, wherein said face of said silicon substrate is rotated on an axis perpendicular to the face whereby the selected region moves horizontally in a circular direction and whereby the face is etched uniformly.

22. The method of claim 20, wherein said reaction gas comprises at least one selected from the group consisting of tetrafluoromethane ($CF_4$), sulfur hexafluoride ($SF_6$), chlorine ($Cl_2$), and hydrogen bromide (HBr).

23. The method recited in claim 20, wherein D.C. electric power is applied to the torch electrodes to generate the arc plasmas; and the torch electrodes are provided with inert gases to generate the arc plasmas.

* * * * *